(12) United States Patent
Luo et al.

(10) Patent No.: US 11,676,521 B2
(45) Date of Patent: Jun. 13, 2023

(54) DISPLAY DEVICE

(71) Applicant: Xiamen Tianma Micro-Electronics Co., Ltd., Xiamen (CN)

(72) Inventors: Sijian Luo, Xiamen (CN); Changzhi Wu, Xiamen (CN); Yumin Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/443,240

(22) Filed: Jul. 22, 2021

(65) Prior Publication Data

US 2021/0375178 A1  Dec. 2, 2021

Related U.S. Application Data

(63) Continuation of application No. PCT/CN2020/099103, filed on Jun. 30, 2020.

(30) Foreign Application Priority Data

Jun. 16, 2020  (CN) .......................... 202010548868.0

(51) Int. Cl.
  *G09G 3/20*  (2006.01)
  *G11C 19/28*  (2006.01)

(52) U.S. Cl.
  CPC ....... *G09G 3/20* (2013.01); *G09G 2310/0243* (2013.01); *G09G 2310/0267* (2013.01);
  (Continued)

(58) Field of Classification Search
  CPC ......... G09G 3/20; G09G 3/3266–3291; G09G 3/3674–3696; G09G 2300/0408;
  (Continued)

(56) References Cited

U.S. PATENT DOCUMENTS

| 5,828,368 A * | 10/1998 | Jung ................... G09G 3/3648 345/99 |
| 2008/0055225 A1* | 3/2008 | Pak ...................... G09G 3/3677 345/100 |

(Continued)

FOREIGN PATENT DOCUMENTS

| CN | 106097951 A | 11/2016 |
| CN | 105185342 B | 3/2018 |

OTHER PUBLICATIONS

International Search Report, International Application No. PCT/CN2020/099103, dated Feb. 26, 2021.

*Primary Examiner* — Nathan Danielsen
(74) *Attorney, Agent, or Firm* — Alston & Bird LLP

(57) ABSTRACT

Provided is a display panel. The display panel includes multiple scanning lines, a gate driver circuit, and a timing controller. The timing controller is configured to: receive multiple data enable signals, generate a gate control signal, and provide the gate control signal for the gate driver circuit. The gate control signal includes a start signal, a first clock signal and a second clock signal. The multiple data enable signals are only within the active cycle. The timing controller is configured to generate a rising edge of the start signal within the vertical blanking cycle of the $(N-1)^{th}$ frame cycle. Alternatively, the timing controller is configured to generate a rising edge and a falling edge of the start signal within a time interval formed by a rising edge and a falling edge of a first data enable signal in the $N^{th}$ frame cycle.

7 Claims, 12 Drawing Sheets

(52) U.S. Cl.
CPC ............... *G09G 2310/0286* (2013.01); *G09G 2310/062* (2013.01); *G09G 2310/08* (2013.01); *G11C 19/287* (2013.01)

(58) Field of Classification Search
CPC ... G09G 2300/0413; G09G 2310/0243; G09G 2310/2067; G09G 2310/0286; G09G 2310/06; G09G 2310/062; G09G 2310/067; G09G 2310/08; G09G 2320/0223; G09G 2320/0252; G11C 19/287
See application file for complete search history.

(56) References Cited

U.S. PATENT DOCUMENTS

| | | | |
|---|---|---|---|
| 2011/0025664 A1* | 2/2011 | Liao ..................... | G09G 3/3696 345/96 |
| 2011/0169789 A1* | 7/2011 | Yamaguchi .......... | G09G 3/3677 345/204 |
| 2012/0146980 A1* | 6/2012 | Lee ..................... | G09G 3/2096 345/204 |
| 2012/0256977 A1* | 10/2012 | Jeong ..................... | G09G 3/00 345/212 |
| 2015/0015564 A1* | 1/2015 | Yamagishi ........... | G09G 3/3648 345/212 |
| 2016/0321983 A1* | 11/2016 | Kim ..................... | G09G 3/2092 |

* cited by examiner

DISPLAY DEVICE

CROSS-REFERENCE TO RELATED APPLICATIONS

This is a continuation of International Patent Application No. PCT/CN2020/099103, filed on Jun. 30, 2020, which claims priority to Chinese Patent Application No. 202010548868.0 filed with the CNIPA on Jun. 16, 2020, the disclosure of which is incorporated herein by reference in its entirety.

TECHNICAL FIELD

The present application relates to the field of display technologies, for example, a display device.

BACKGROUND

With the development of display technologies, the liquid crystal display (LCD) panel and the organic light-emitting diode (OLED) display panel have gradually become two mainstream display panels in the display field. The LCD panel and the OLED display panel are widely used in computers, mobile phones, wearable devices, vehicles and other devices (including display devices) or scenarios integrated with a display function and known to those having ordinary skill in the art.

A display device in the related art includes a display area and a bezel area surrounding the display area. In the display device, a gate driver circuit integrated in the bezel area controls a thin film transistor to be turned on or off. When the thin film transistor is turned on, a source driver circuit integrated in the bezel area provides gray scale signals for pixels in the display area, so as to control the row of pixels to display an image. However, when a timing controller generates a gate control signal according to a data enable signal, the gate control signal may be abnormal.

SUMMARY

The present application provides a display device, avoiding the case of generating an abnormal gate control signal.

An embodiment of the present application provides a display panel. The display panel includes: multiple scanning lines, a gate driver circuit connected to the multiple scanning lines, and a timing controller electrically connected to the gate driver circuit.

The timing controller is configured to: receive multiple data enable signals within each frame cycle of multiple frame cycles, generate a gate control signal according to the multiple data enable signals, and provide the gate control signal for the gate driver circuit. The gate driver circuit is configured to provide scanning signals for the multiple scanning lines according to the gate control signal. The gate control signal includes a start signal, a first clock signal and a second clock signal.

Each frame cycle includes an active cycle and a vertical blanking cycle. The multiple data enable signals are only within the active cycle.

The timing controller is configured to generate a rising edge of the start signal within the vertical blanking cycle of an $(N-1)^{th}$ frame cycle. A time interval between a falling edge of the last data enable signal in the $(N-1)^{th}$ frame cycle and the rising edge of the start signal is T. T is greater than 0 and less than a first preset time interval, or T is greater than 0 and equal to a first preset time interval. The first preset time interval is less than $$\frac{2}{3}$$

of the vertical blanking cycle.

Alternatively, the timing controller is configured to generate a rising edge and a falling edge of the start signal within a time interval formed by a rising edge and a falling edge of the first data enable signal in an $N^{th}$ frame cycle; where $N \geq 2$.

DETAILED DESCRIPTION

Figure 1:
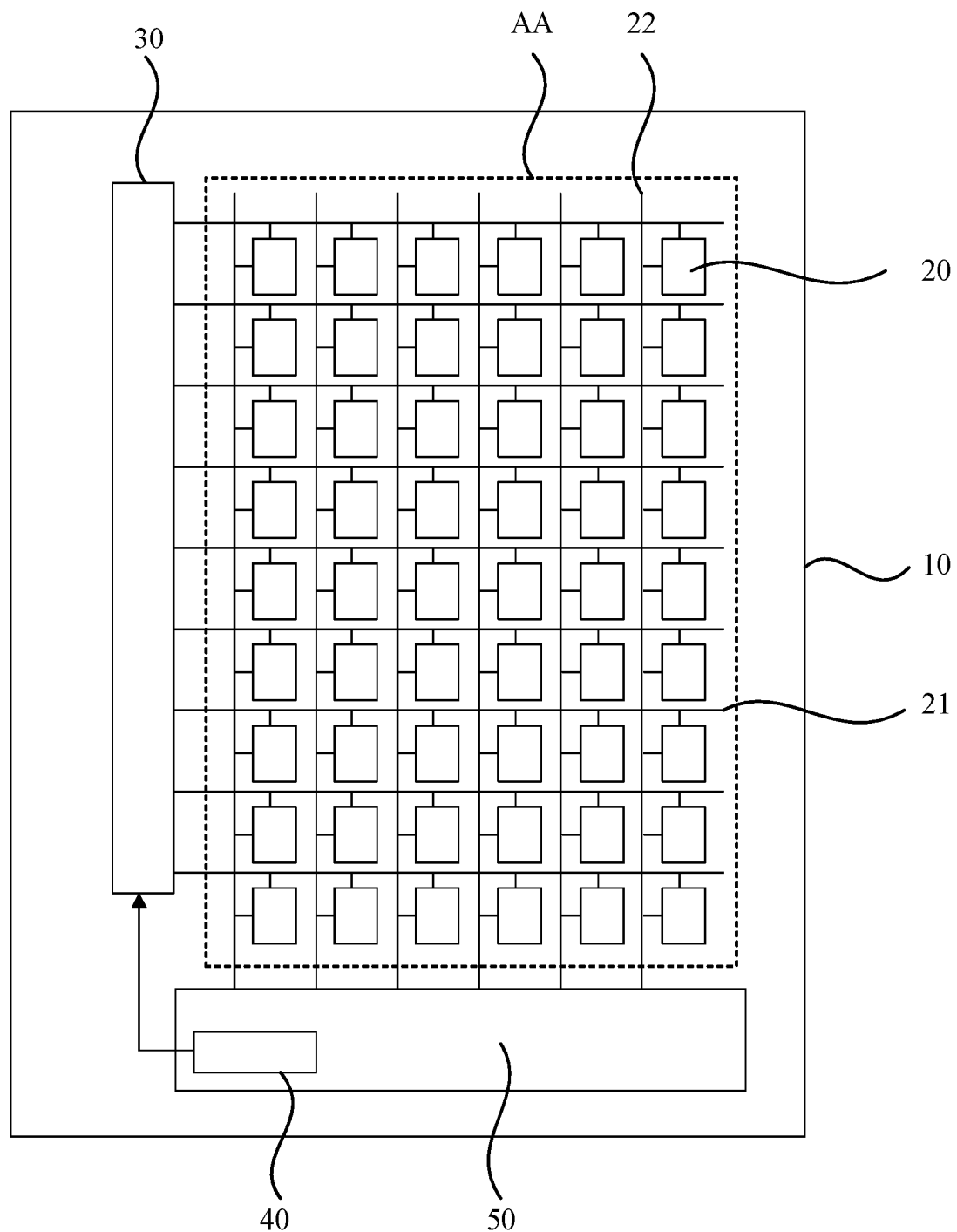
FIG. 1 is a top view of a display device according to an embodiment of the present disclosure.

The present disclosure is described below in conjunction with drawings and embodiments. The embodiments described herein are merely intended to explain the present application and not to limit the present application. Additionally, for ease of description, only part, not all, of structures related to the present application are illustrated in the drawings.

Figure 2:
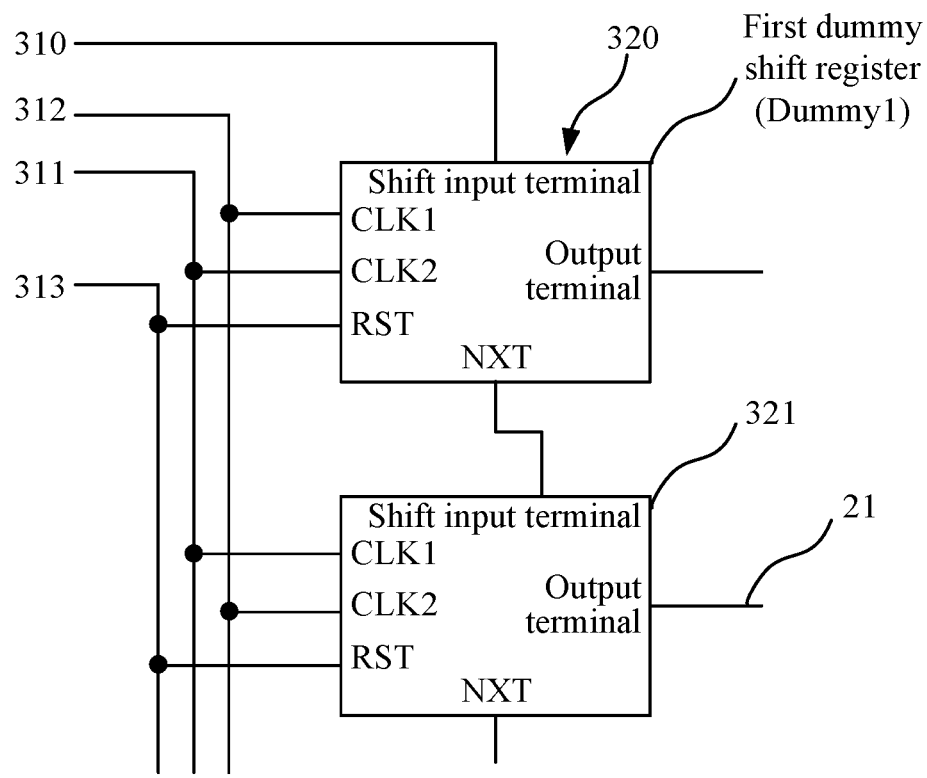
FIG. 2 is a schematic diagram of a gate driver circuit according to an embodiment of the present disclosure.
Figure 3:
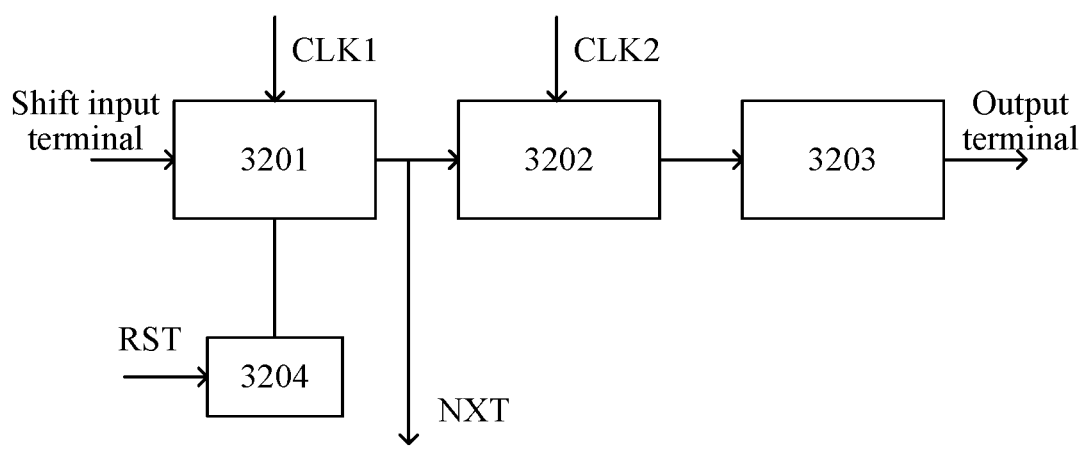
FIG. 3 is a schematic diagram of a shift register according to an embodiment of the present disclosure.

FIG. 1 is a top view of a display device according to an embodiment of the present disclosure. FIG. 2 is a schematic diagram of a gate driver circuit according to an embodiment of the present application. FIG. 3 is a schematic diagram of a shift register according to an embodiment of the present application. Referring to FIGS. 1, 2 and 3, a part of structures of the display device are omitted in FIG. 1, and the display device includes multiple scanning lines 21, a gate driver circuit 30 and a timing controller 40. The gate driver circuit 30 is electrically connected to the multiple scanning lines 21. The gate driver circuit 30 is configured to provide scanning signals for the multiple scanning lines 21. The timing controller 40 is electrically connected to the gate driver circuit 30. The timing controller 40 is configured to: receive a data enable signal, generate a gate control signal according to the data enable signal, and provide the gate control signal for the gate driver circuit 30. The gate control signal includes a start signal, a first clock signal and a second clock signal. Each frame cycle includes an active cycle and a vertical blanking cycle. The data enable signal is only within the active cycle. Referring to FIGS. 1, 2 and 3, the gate driver circuit 30 includes a start signal line 310 for transmitting the start signal STV, a first clock signal line 311 for transmitting the first clock signal CKV1, a second clock signal line 312 for transmitting the second clock signal CKV2, and multiple cascaded shift registers 320. A shift register at each stage includes a shift input terminal IN, an output terminal OUT, a first signal terminal CLK1, a second signal terminal CLK2 and a cascade signal terminal NXT. The multiple shift registers 320 include a first dummy shift register Dummy1 and a first-stage scanning shift register 321. The first-stage scanning shift register 321 and the first dummy shift register Dummy1 are cascaded. The first signal terminal CLK1 of the first dummy shift register Dummy1 is connected to the second clock signal line 312. The second signal terminal CLK2 of the first dummy shift register Dummy1 is connected to the first clock signal line 311. The first signal terminal CLK1 of the first-stage scanning shift register 321 is connected to the first clock signal line 311. The second signal terminal CLK2 of the first-stage scanning shift register 321 is connected to the second clock signal line 312. The shift input terminal IN of the first dummy shift register Dummy1 is connected to the start signal line 310. The shift input terminal IN of the first-stage scanning shift register 321 is connected to the cascade signal terminal NXT of the first dummy shift register Dummy1. In one example, the gate driver circuit 30 may further include a reset signal line 313 for transmitting a reset signal. The shift register 320 at each stage may include a reset terminal RST. Reset terminals RST of all shift registers 320 are electrically connected to the reset signal line 313. The circuit structure of the shift register 320 may include, for example, a latch circuit 3201, an NAND circuit 3202 and a buffer circuit 3203. The latch circuit 3201 is electrically connected to the NAND circuit 3202. The NAND circuit 3202 is electrically connected the buffer circuit 3203. The latch circuit 3201 includes a shift input terminal IN and a first signal terminal CLK1. An output terminal of the latch circuit 3201 is the cascade signal terminal NXT (that is, an input terminal of the NAND circuit 3202 to which the latch circuit 3201 is electrically connected). Another input terminal of the NAND circuit 3202 is the second signal terminal CLK2. In the NAND circuit 3202, an NAND operation is performed on input signals of the two input terminals of the NAND circuit 3202. An output terminal of the NAND circuit 3202 is electrically connected to an input terminal of the buffer circuit 3203. An output terminal of the buffer circuit 3203 is the output terminal OUT of the shift register 320. In one example, the circuit structure of the shift register 320 may further include a reset circuit 3204. An input terminal of the reset circuit 3204 is the reset terminal RST. An output terminal of the reset circuit 3204 is electrically connected to the latch circuit 3201.

In the exemplary FIG. 2 and FIG. 3, for the first dummy shift register Dummy1, when the second clock signal CKV2 input through the first signal terminal CLK1 is at a high level, the start signal STV input through the shift input terminal IN is latched into the latch circuit 3201, and the cascade signal terminal NXT changes from a low level to a high level at a rising edge of the second clock signal CKV2 and lasts until a rising edge of the next high level of the second clock signal CKV2. In the NAND circuit 3202, the NAND operation is performed on a signal input through the cascade signal terminal NXT and the first clock signal CKV1 input through the second signal terminal CLK2. A result of the NAND operation is output to the buffer circuit 3203 to output through the output terminal OUT of the buffer circuit 3203. The buffer circuit 3203 is configured to enhance the driving capability of signals. The operating process of the first-stage scanning shift register 321 is similar to that of the first dummy shift register Dummy1, and the difference is that in the NAND circuit 3202, the NAND operation is performed on a signal input through the cascade signal terminal NXT in the first-stage scanning shift register 321 and the second clock signal CKV2 input through the second signal terminal CLK2, which is not repeated here. Referring to FIG. 1, the display device further includes a substrate 10, multiple data lines 22 and a driver chip 50. The multiple scanning lines 21, the multiple data lines 22, the gate driver circuit 30 and the timing controller 40 are located on the same side of the substrate 10. The multiple scanning lines 21 intersect with the multiple data lines 22 in an insulating manner, and the multiple scanning lines 21 and the multiple data lines 22 define multiple pixels 20 in an intersecting manner. The multiple pixels 20 are arranged in an array within the display area AA. The timing controller 40 is integrated in the driver chip 50. The driver chip 50 may further include a source driver circuit (not shown in FIG. 1) for providing gray scale voltages for the data lines 22. In other implementation modes, the timing controller 40 may further be configured outside the driver chip 50, which is not limited to this application.

Figure 4:
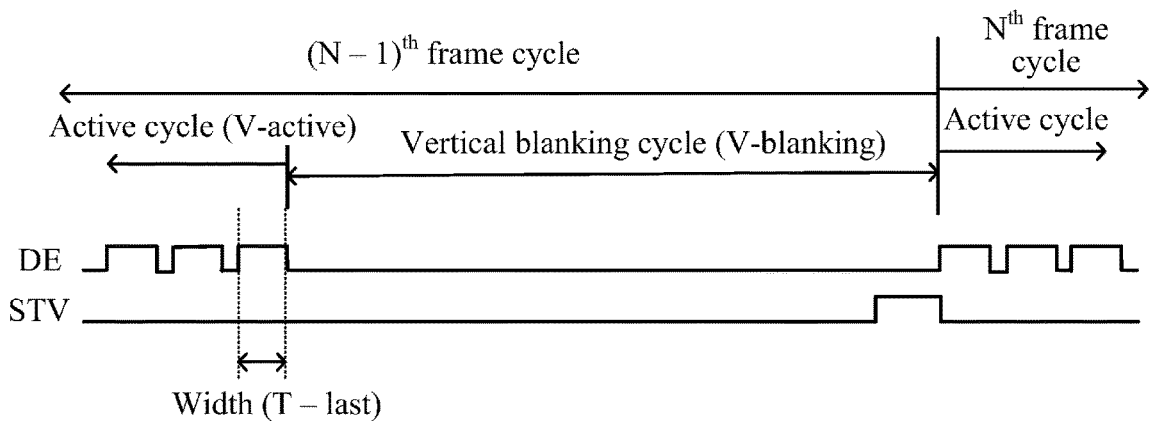
FIG. 4 is a driving timing diagram of a display device in the related design.

FIG. 4 is a driving timing diagram of a conventional display device. Referring to FIG. 4, the timing controller 40 generates a rising edge and a falling edge of a start signal STV in a vertical blanking cycle V-blanking of an $(N-1)^{th}$ frame cycle. The rising edge of the start signal STV is adjacent to a rising edge of the first data enable signal in an $N^{th}$ frame cycle. The falling edge of the start signal STV is generated when the rising edge of the first data enable signal in the $N^{th}$ frame cycle is generated. That is, the generation time for the rising edge of the start signal STV is close to the generation time for the rising edge of the first data enable signal in the $N^{th}$ frame cycle. Since the data enable signal DE is located only within an active cycle V-active instead of the vertical blanking cycle V-blanking, the rising edge of the start signal STV cannot be accurately generated with reference to the data enable signal DE, and the rising edge of the start signal STV may be merely estimated according to the width of the last data enable signal DE in the $(N-1)^{th}$ frame cycle. For example, the width of the last data enable signal DE in the $(N-1)^{th}$ frame cycle is (T-last), and the rising edge of the start signal STV is generated after a counter counts to a $100^{th}$ (T-last). Due to clock jitter and other factors, the width (T-last) of the last data enable signal DE in the $(N-1)^{th}$ frame cycle also generates corresponding jitter. As a result, a gate control signal is normal in some time periods but abnormal in other time periods.

A display device, in accordance with one embodiment of the present disclosure, accurately estimates a rising edge of a start signal STV. In other words, in the embodiments of the present disclosure, the generation of the abnormal gate control signal is avoided through the design of the start signal STV.

Figure 5:
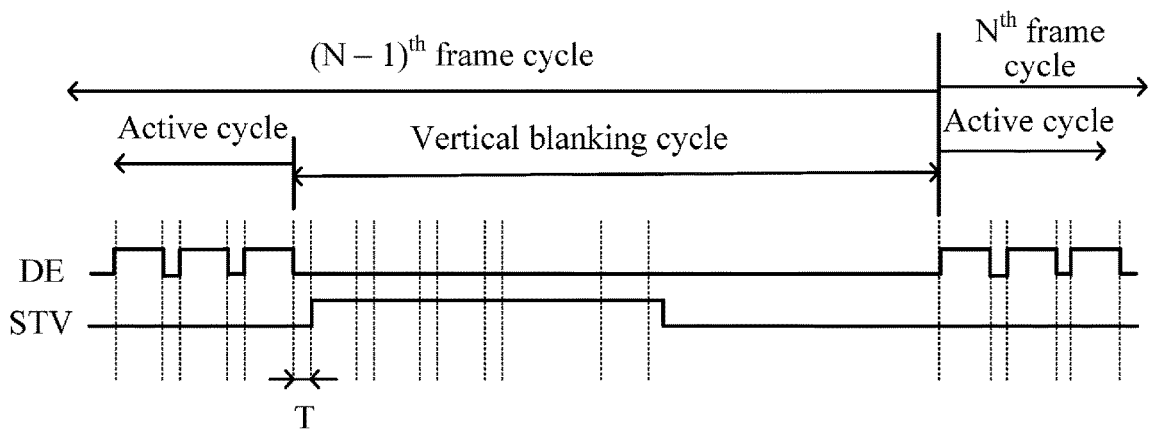
FIG. 5 is a drive timing diagram of a display device according to an embodiment of the present disclosure.

FIG. 5 is a driving timing diagram of a display device according to an embodiment of that present application. Referring to FIG. 5, the timing controller 40 generates a rising edge of the start signal STV within the vertical blanking cycle V-blanking of the $(N-1)^{th}$ frame cycle, and a time interval between a falling edge of the last data enable signal DE in the $(N-1)^{th}$ frame cycle and the rising edge of the start signal STV is T. T is greater than 0 and less than a first preset time interval, or T is greater than 0 and equal to a first preset time interval. The first preset time interval is less than $$\frac{2}{3}$$

of the vertical blanking cycle, where N≥2. In multiple embodiments of the present disclosure, expressions such as "in", "inside" and "within" include endpoint values. For example, the rising edge of the start signal STV being generated within the vertical blanking cycle V-blanking of the $(N-1)^{th}$ frame cycle refers to that the rising edge of the start signal STV is generated when the falling edge of the last data enable signal DE in the $(N-1)^{th}$ frame cycle is generated, after the falling edge of the last data enable signal DE in the $(N-1)^{th}$ frame cycle is generated and when a rising edge of the first data enable signal DE in the $N^{th}$ frame cycle is generated, and before a rising edge of the first data enable signal DE in the $N^{th}$ frame cycle is generated. In multiple embodiments of the present disclosure, expressions such as "after", "later", "before" and "prior to" refer to a sequence in chronological order. For example, B being generated after A refers to that in chronological order, A is firstly generate, and then, B is generated; and B being generated before A refers to that in chronological order, B is firstly generated, and then, A is generated.

Figure 6:
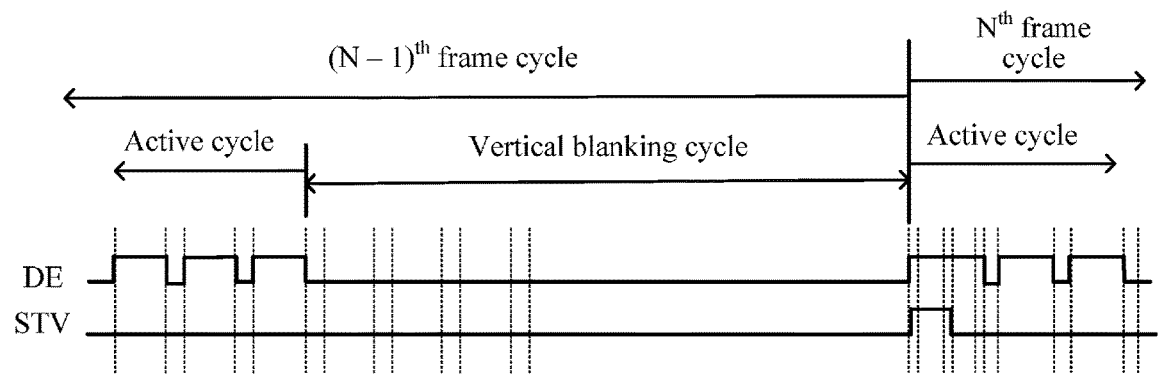
FIG. 6 is a driving timing diagram of a display device according to another embodiment of the present disclosure.

FIG. 6 is a driving timing diagram of a display device according to one embodiment. Referring to FIG. 6, the timing controller 40 generates a rising edge and a falling edge of the start signal STV within a time interval formed by a rising edge and a falling edge of the first data enable signal DE in the $N^{th}$ frame cycle. N≥2. That is, the rising edge of the start signal STV is generated when the rising edge of the first data enable signal DE in the $N^{th}$ frame cycle is generated; or, the rising edge of the start signal STV is generated after the rising edge of the first data enable signal DE in the $N^{th}$ frame cycle. The falling edge of the start signal STV is generated when the falling edge of the first data enable signal DE in the $N^{th}$ frame cycle is generated; or, the falling edge of the start signal STV is generated before the falling edge of the first data enable signal DE in the $N^{th}$ frame cycle.

Referring to FIG. 1 and FIG. 2, for the display device in which the gate drive circuit 30 is integrated in a display panel (that is, gate in panel, GIP), the gate drive circuit 30 includes the multiple cascaded shift registers 320, and the first shift register 320 may be configured as the first dummy shift register Dummy1. Multiple cascaded scanning shift registers are further disposed after the first dummy shift register Dummy1. The first shift register 320 after the first dummy shift register Dummy1 is the first-stage scanning shift register 321. The first-stage scanning shift register 321 provides scanning signals for a first row of scanning lines 21. A row of buffers may be disposed inside the driver chip 50 to reduce costs. In this case, within a time interval formed by a rising edge and a falling edge of a second data enable signal DE in the $N^{th}$ frame cycle, a row of thin film transistors electrically connected to the first row of scanning lines 21 need to be turned on through the first row of scanning lines 21 (when signals on the scanning lines 21 are at the high level), and signals on the data lines 22 are transmitted to pixel electrodes of the row of sub-pixels through the row of thin film transistors.

Referring to FIG. 6, in order to ensure that a row of data is transmitted to the data lines 22 through the source driver circuit in the driver chip 50 within the time interval formed by the rising edge and the falling edge of the second data enable signal DE in the $N^{th}$ frame cycle, it is necessary to generate the rising edge and the falling edge of the start signal STV within the time interval formed by the rising edge and the falling edge of the first data enable signal DE in the $N^{th}$ frame cycle. If the rising edge of the start signal STV is generated within the time interval formed by the rising edge and the falling edge of the first data enable signal DE in the $N^{th}$ frame cycle, and the falling edge of the start signal STV is generated within the time interval formed by the rising edge and the falling edge of the second data enable signal DE in the $N^{th}$ frame cycle, the row of data transmitted by the source driver circuit may be delayed until a time interval formed by a rising edge and a falling edge of a third data enable signal DE in the $N^{th}$ frame cycle, thus causing the scanning signals to not be synchronized with the timing of gray scale signals.

In the display device provided by an embodiment of the present disclosure, the rising edge of the start signal STV may be generated within the vertical blanking cycle V-blanking of the $(N-1)^{th}$ frame cycle, and the time interval between the falling edge of the last data enable signal DE in the $(N-1)^{th}$ frame cycle and the rising edge of the start signal STV is less than $$\frac{2}{3}$$

of the vertical blanking cycle, so that a time interval between the falling edge of the last data enable signal DE in the $(N-1)^{th}$ frame cycle and the rising edge of the start signal STV is shorter than that in the related design. Even if the width of the last data enable signal DE in the $(N-1)^{th}$ frame cycle jitters in multiple frame cycles, there is a little influence on the generation time for the rising edge of the start signal STV, thereby resulting in an accurate estimation of the rising edge of a start signal STV. In the display device provided by an embodiment of the present disclosure, the rising edge and a falling edge of the start signal STV may further be generated within the time interval formed by the rising edge and the falling edge of the first data enable signal DE in the $N^{th}$ frame cycle, so that the rising edge of the start signal STV can be accurately generated with reference to the first data enable signal DE in the $N^{th}$ frame cycle, thereby resulting in an accurate estimation of the rising edge of a start signal STV. Accordingly the generation of an abnormal gate control signal is avoided through the design of the start signal STV.

Referring to FIG. 5, when the timing controller 40 generates the rising edge of the start signal STV within the vertical blanking cycle V-blanking of the $(N-1)^{th}$ frame cycle, the rising edge of the start signal STV is generated after the falling edge of the last data enable signal DE in the $(N-1)^{th}$ frame cycle. That is, in chronological order, the falling edge of the last data enable signal DE in the $(N-1)^{th}$ frame cycle is firstly generated, and the rising edge of the start signal STV is generated after a period of time since the falling edge of the last data enable signal DE in the $(N-1)^{th}$ frame cycle is generated.

When the timing controller 40 generates the rising edge of the start signal STV within the vertical blanking cycle V-blanking of the $(N-1)^{th}$ frame cycle, the falling edge of the start signal STV is generated within the vertical blanking cycle V-blanking of the $(N-1)^{th}$ frame cycle. Accordingly, both the rising edge and the falling edge of the start signal STV are generated within the vertical blanking cycle V-blanking of the $(N-1)^{th}$ frame cycle.

Figure 7:
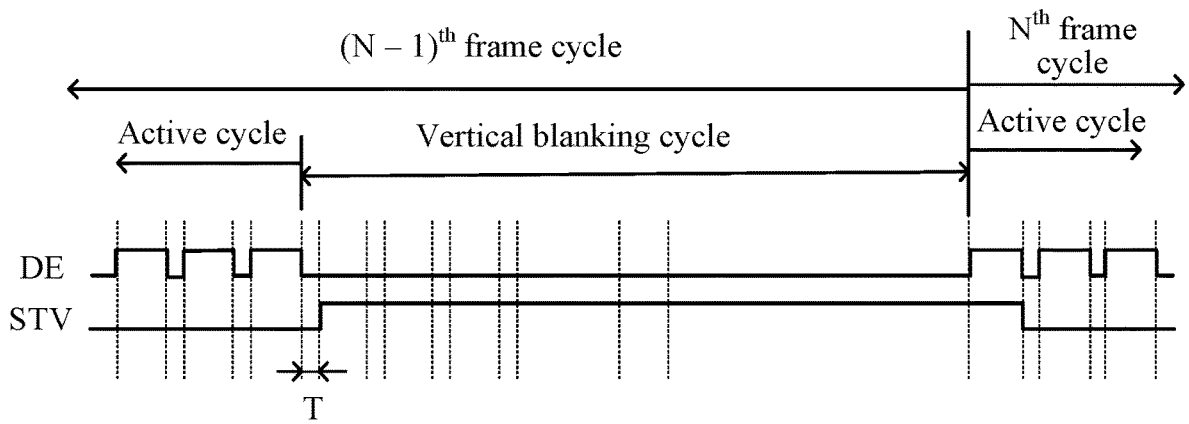
FIG. 7 is a driving timing diagram of a display device according to another embodiment of the present disclosure.

FIG. 7 is a driving timing diagram of a display device according to another embodiment of the present application. When the timing controller 40 generates the rising edge of the start signal STV within the vertical blanking cycle V-blanking of the $(N-1)^{th}$ frame cycle, the falling edge of the start signal STV is generated within a time interval formed by the rising edge and the falling edge of the first data enable signal DE in the $N^{th}$ frame cycle. That is, the falling edge of the start signal STV may be aligned with the rising edge of the first data enable signal DE in the $N^{th}$ frame cycle, or the falling edge of the start signal STV may be aligned with the falling edge of the first data enable signal DE in the $N^{th}$ frame cycle, or the falling edge of the start signal STV may be located between the generation time for the rising edge of the first data enable signal DE in the $N^{th}$ frame cycle and the generation time for the falling edge of the first data enable signal DE in the $N^{th}$ frame cycle. Since the falling edge of the start signal STV is generated within the time interval formed by the rising edge and the falling edge of the first data enable signal DE in the $N^{th}$ frame cycle, the falling edge of the start signal STV may be generated according to the first data enable signal DE in the $N^{th}$ frame cycle, thereby reducing the control difficulty for the falling edge of the start signal STV.

Figure 8:
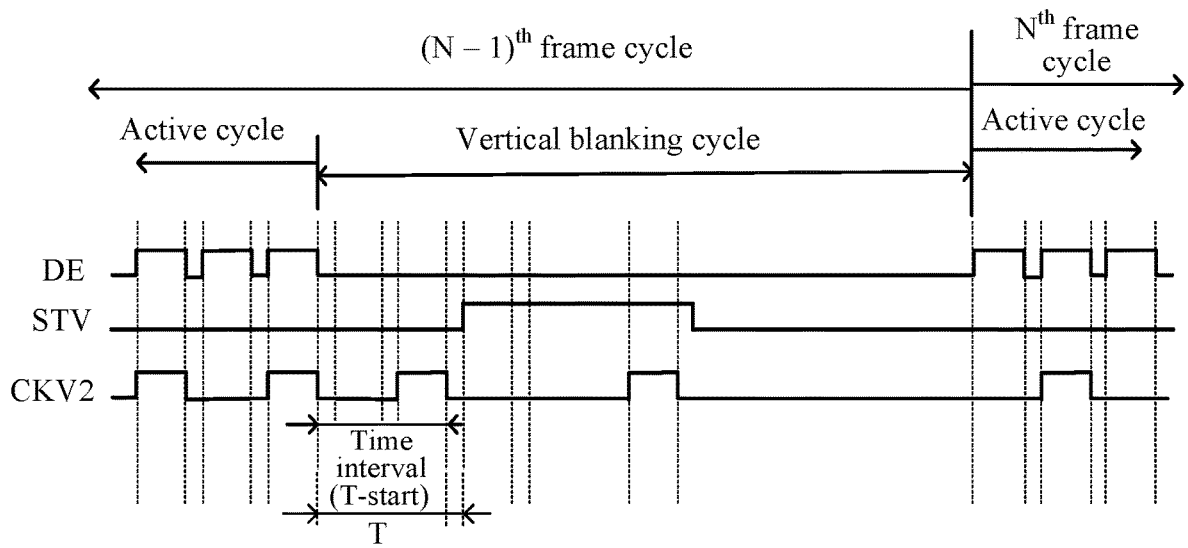
FIG. 8 is a driving timing diagram of a display device according to another embodiment of the present disclosure.

FIG. 8 is a driving timing diagram of a display device according to another embodiment of the present application. Referring to FIG. 8, when the timing controller 40 generates the rising edge of the start signal STV within the vertical blanking cycle V-blanking of the $(N-1)^{th}$ frame cycle, P second clock signals CKV2 are generated within the $(N-1)^{th}$ frame cycle. A time interval between the falling edge of the last data enable signal DE in the $(N-1)^{th}$ frame cycle and a falling edge of a $(P-1)^{th}$ second clock signal CKV2 is (T-start), where T is greater than (T-start), and P≥2. In this embodiment of the present application, first (P-1) second clock signals CKV2 among the P second clock signals CKV2 are firstly generated, and then, the rising edge of the start signal STV is generated, so that scanning of the $(N-1)^{th}$ frame cycle is completed before the rising edge of the start signal STV is generated. In FIG. 8, an explanation is given using an example where P=2. The time interval between the falling edge of the last data enable signal DE in the $(N-1)^{th}$ frame cycle and the falling edge of the $1^{st}$ second clock signal CKV2 is (T-start), which is not intended to limit this embodiment of the present disclosure. In operation, when, for example, P=3 and 3 second clock signals CKV2 are generated within the $(N-1)^{th}$ frame cycle, the time interval between the falling edge of the last data enable signal DE in the $(N-1)^{th}$ frame cycle and the falling edge of the $2^{nd}$ second clock signal CKV2 is (T-start), where T is greater than (T-start). When, for example, P=10 and 10 second clock signals CKV2 are generated within the $(N-1)^{th}$ frame cycle, the time interval between the falling edge of the last data enable signal DE in the $(N-1)^{th}$ frame cycle and the falling edge of the $9^{th}$ second clock signal CKV2 is (T-start), where T is greater than (T-start).

Figure 9:
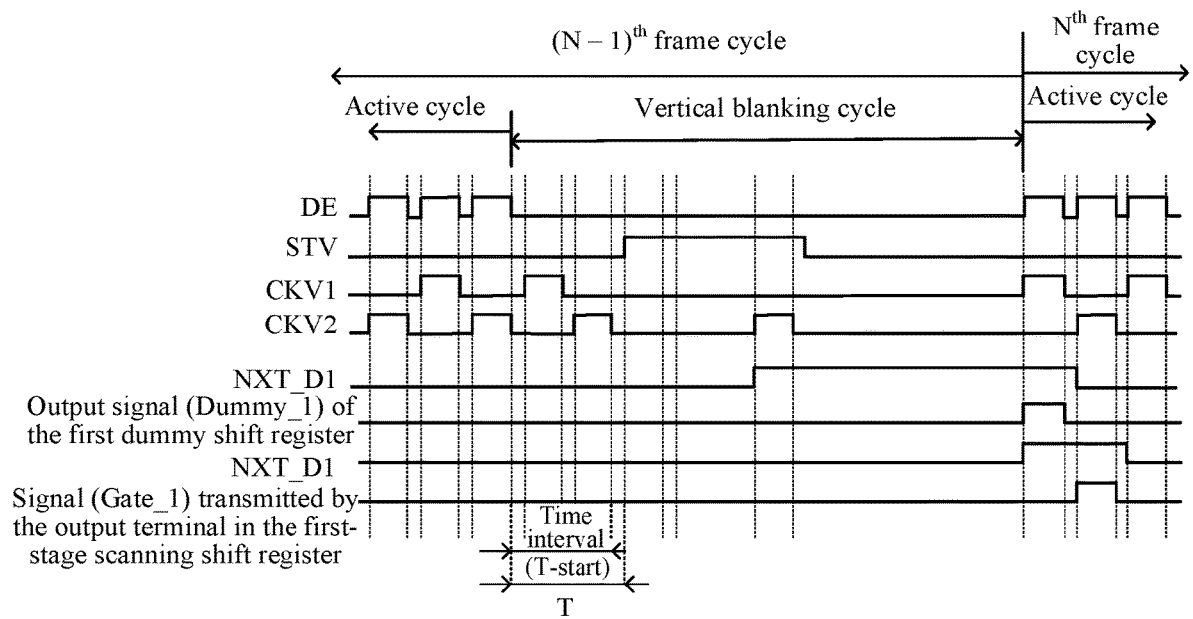
FIG. 9 is a driving timing diagram of a display device according to another embodiment of the present disclosure.

FIG. 9 is a driving timing diagram of a display device according to another embodiment of the present disclosure. Referring to FIG. 9, when the timing controller 40 generates the rising edge of the start signal STV in the vertical blanking cycle V-blanking of the $(N-1)^{th}$ frame cycle, for the $1^{st}$ first clock signal CKV1 in the $N^{th}$ frame cycle, a falling edge of the first clock signal CKV1 is generated when a falling edge of the first data enable signal DE in the $N^{th}$ frame cycle is generated, and a rising edge of the first clock signal CKV1 is generated within a time interval formed by the falling edge of the start signal STV and the rising edge of the first data enable signal DE in the $N^{th}$ frame cycle. That is, the rising edge of the first clock signal CKV1 is generated when the falling edge of the start signal STV is generated; or, the rising edge of the first clock signal CKV1 is generated when the rising edge of the first data enable signal DE in the $N^{th}$ frame cycle is generated, or the rising edge of the first clock signal CKV1 is generated between the generation time for the falling edge of the start signal STV and the generation time for the rising edge of the first data enable signal DE in the $N^{th}$ frame cycle. Accordingly, if the falling edge of the first clock signal CKV1 in the $N^{th}$ frame cycle is generated within a time interval formed by the rising edge and the falling edge of the second data enable signal DE, the high-level time of signals Gate_1 on the first row of scanning lines 21 (that is, signals transmitted through the output terminal OUT of the first-stage scanning shift register 321) is accordingly delayed until the third data enable signal DE. In this way, gray scale signals are misaligned by one row, and gray scale signals in the first row are displayed in the second row of pixels 20. When the timing controller 40 generates the rising edge of the start signal STV within the vertical blanking cycle V-blanking of the $(N-1)^{th}$ frame cycle, for the 1st first clock signal CKV1 in the $N^{th}$ frame cycle, the falling edge of the first clock signal CKV1 is generated when the falling edge of the first data enable signal DE in the $N^{th}$ frame cycle is generated, thereby ensuring that the time of scanning signals is synchronized with the timing of gray scale signals. The drive timing diagram shown in FIG. 9 corresponds to an even number of scanning shift registers, which is merely an example and is not intended to limit the present disclosure. In other implementation modes, the driving timing for an odd number of scanning shift registers also satisfies the preceding embodiment. For example, in the drive timing of an odd number of scanning shift registers, the time interval between the falling edge of the last data enable signal DE in the $(N-1)^{th}$ frame cycle and the rising edge of the start signal STV is T, where T is greater than 0 and less than a first preset time interval, or T is greater than 0 and equal to a first preset time interval, and the first preset time interval is less than $$\frac{2}{3}$$

of a vertical blanking cycle.

Referring to FIGS. 5, 7, 8 and 9, the first preset time interval may be less than half of the vertical blanking cycle. A smaller range is set for the first preset time interval, so that the time interval between the falling edge of the last data enable signal DE in the $(N-1)^{th}$ frame cycle and the rising edge of the start signal STV is limited within a smaller time range, thereby ensuring that the timing controller 40 does not generate an abnormal gate control signal.

Referring to FIG. 6, when the timing controller 40 generates the rising edge and the falling edge of the start signal STV within the time interval between the rising edge and the falling edge of the first data enable signal DE in the $N^{th}$ frame cycle, the rising edge of the start signal STV is generated when the rising edge of the first data enable signal DE is generated. Accordingly, the rising edge of the first data enable signal DE in the $N^{th}$ frame cycle is aligned with the rising edge of the start signal STV. That is, the rising edge of the first data enable signal DE in the $N^{th}$ frame cycle and the rising edge of the start signal STV are generated at the same time. Since the rising edge of the start signal STV is generated within the time interval formed by the rising edge and the falling edge of the first data enable signal DE in the $N^{th}$ frame cycle, the rising edge of the start signal STV may be generated according to the first data enable signal DE in the $N^{th}$ frame cycle, thereby reducing the difficulty in controlling the rising edge of the start signal STV.

Figure 10:
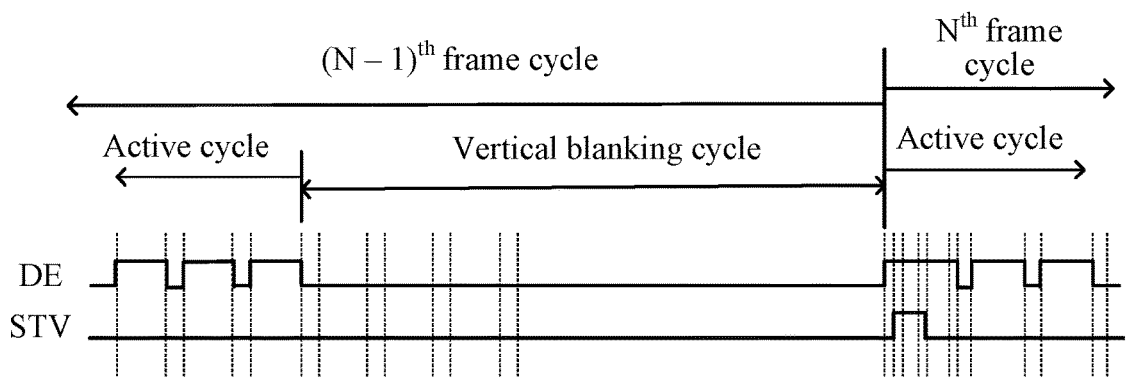
FIG. 10 is a driving timing diagram of a display device according to another embodiment of the present disclosure.

FIG. 10 is a driving timing diagram of a display device according to another embodiment of the present disclosure. When the timing controller 40 generates the rising edge and the falling edge of the start signal STV within the time interval formed by the rising edge and the falling edge of the first data enable signal DE in the $N^{th}$ frame cycle, the rising edge of the start signal STV is generated after the rising edge of the first data enable signal DE in the $N^{th}$ frame cycle. That is, in chronological order, the rising edge of the first data enable signal DE in the $N^{th}$ frame cycle is firstly generated, and the rising edge of the start signal STV is generated after a period of time since the rising edge of the first data enable signal DE in the $N^{th}$ frame cycle is generated. Accordingly, since the rising edge of the start signal STV is generated after the rising edge of the first data enable signal DE in the $N^{th}$ frame cycle, the rising edge of the start signal STV and the rising edge of the first data enable signal DE in the $N^{th}$ frame cycle are generated at different time moments, therefore the switching of multiple signals at the same time can be avoided, being conducive to avoiding the electromagnetic interference.

Figure 11:
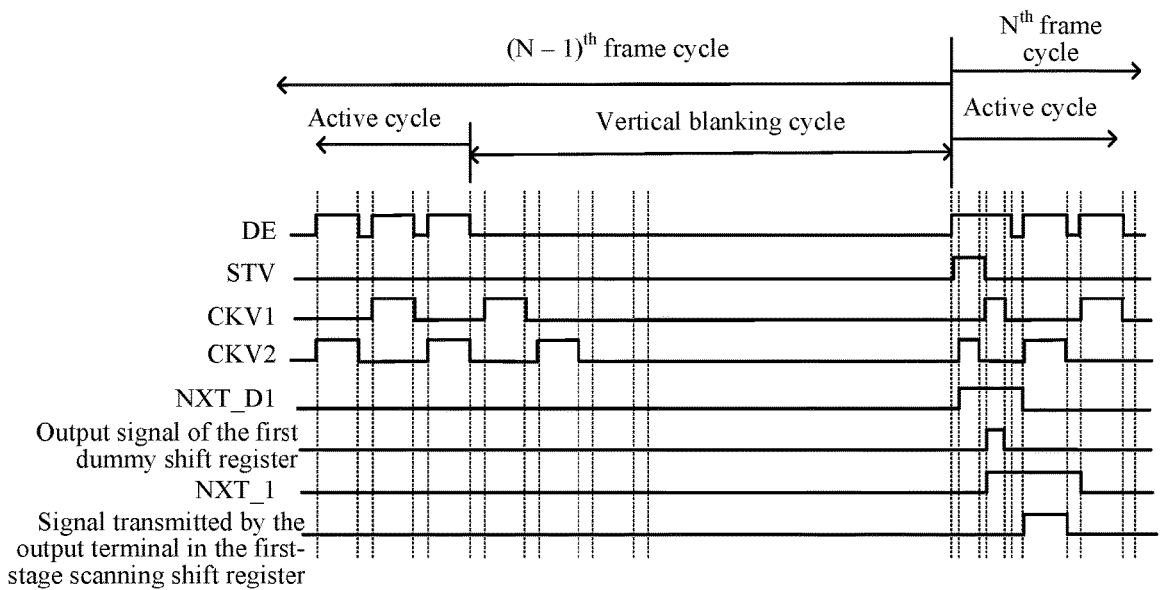
FIG. 11 is a driving timing diagram of a display device according to another embodiment of the present disclosure.

FIG. 11 is a driving timing diagram of a display device according to another embodiment of the present disclosure. When the timing controller 40 generates the rising edge and the falling edge of a start signal STV within the time interval formed by the rising edge and the falling edge of the first data enable signal DE in the $N^{th}$ frame cycle, a rising edge and a falling edge of the first clock signal CKV1 are generated within the time interval formed by the rising edge and the falling edge of the first data enable signal DE in the $N^{th}$ frame cycle. That is, the rising edge of the first clock signal CKV1 is generated when the rising edge of the first data enable signal DE in the $N^{th}$ frame cycle is generated; or, the rising edge of the first clock signal CKV1 is generated after the rising edge of the first data enable signal DE in the $N^{th}$ frame cycle. The falling edge of the first clock signal CKV1 is generated when the falling edge of the first data enable signal DE in the $N^{th}$ frame cycle is generated; or, the falling edge of the first clock signal CKV1 is generated before the falling edge of the first data enable signal DE in the $N^{th}$ frame cycle. It may be seen that both the case where the timing controller 40 generates the rising edge and the falling edge of the start signal STV within the time interval formed by the rising edge and the falling edge of the first data enable signal DE in the $N^{th}$ frame cycle, and the case where the timing controller 40 generates the rising edge of the start signal STV within the vertical blanking cycle V-blanking of the $(N-1)^{th}$ frame cycle, the falling edge of the first clock signal CKV1 needs to be generated within the time interval formed by the rising edge and the falling edge of the first data enable signal DE in the $N^{th}$ frame cycle. If the falling edge of the first clock signal CKV1 in the $N^{th}$ frame cycle is generated within a time interval formed by the rising edge and the falling edge of the second data enable signal DE, the high-level time of signals Gate_1 on the first row of scanning lines 21 is accordingly delayed until the third data enable signal DE. In this way, gray scale signals are misaligned by one row, and the gray scale signals in the first row are displayed in the second row of pixels 20. When the timing controller 40 generates the rising edge and the falling edge of the start signal STV within the time interval formed by the rising edge and the falling edge of the first data enable signal DE in the $N^{th}$ frame cycle, the rising edge and the falling edge of the first clock signal CKV1 are generated within the time interval formed by the rising edge and the falling edge of the first data enable signal DE in the $N^{th}$ frame cycle, thus ensuring that the timing of scanning signals is synchronized with the timing of gray scale signals.

Referring to FIG. 11, within the time interval formed by the rising edge and the falling edge of the first data enable signal DE in the $N^{th}$ frame cycle, the rising edge of the first clock signal CKV1 is generated after the falling edge of the second clock signal CKV2. That is, in chronological order, the falling edge of the second clock signal CKV2 is firstly generated, and the rising edge of the first clock signal CKV1 is generated after a period of time since the falling edge of the second clock signal CKV2 is generated. Referring to FIG. 3, since the NAND circuit 3202 is included within the shift register 320 in the gate driver circuit 30, one input signal of the NAND circuit 3202 is the first clock signal CKV1 or the second clock signal CKV2, and the other input signal of the NAND circuit 3202 (for example, a signal input through the shift input terminal IN of the shift register is latched by the latch circuit 3201 and is output to the cascade signal terminal NXT of the NAND circuit 3202) is also directly related to the first clock signal CKV1 and the second clock signal CKV2. If the rising edge of the first clock signal CKV1 is aligned with the falling edge of the second clock signal CKV2, since the rising edge and the falling edge occupy a certain amount of time in the actual timing instead of being directly converted from the low level to the high level or from the high level to the low level, glitches are generated in the NAND operation, resulting in unstable output.

Referring to FIG. 11, when the timing controller 40 generates the rising edge and the falling edge of the start signal STV within the time interval formed by the rising edge and the falling edge of the first data enable signal DE in the $N^{th}$ frame cycle, within the time interval formed by the rising edge and the falling edge of the first data enable signal DE in the $N^{th}$ frame cycle, the falling edge of the start signal STV is generated before the rising edge of the first clock signal CKV1; or, the falling edge of the start signal STV is generated when the rising edge of the first clock signal CKV1 is generated. That is, within the time interval formed by the rising edge and the falling edge of the first data enable signal DE in the $N^{th}$ frame cycle, the rising edge and the falling edge of the start signal STV are firstly generated in chronological order, and then, the rising edge and the falling edge of the first clock signal CKV1 are generated.

Figure 12:
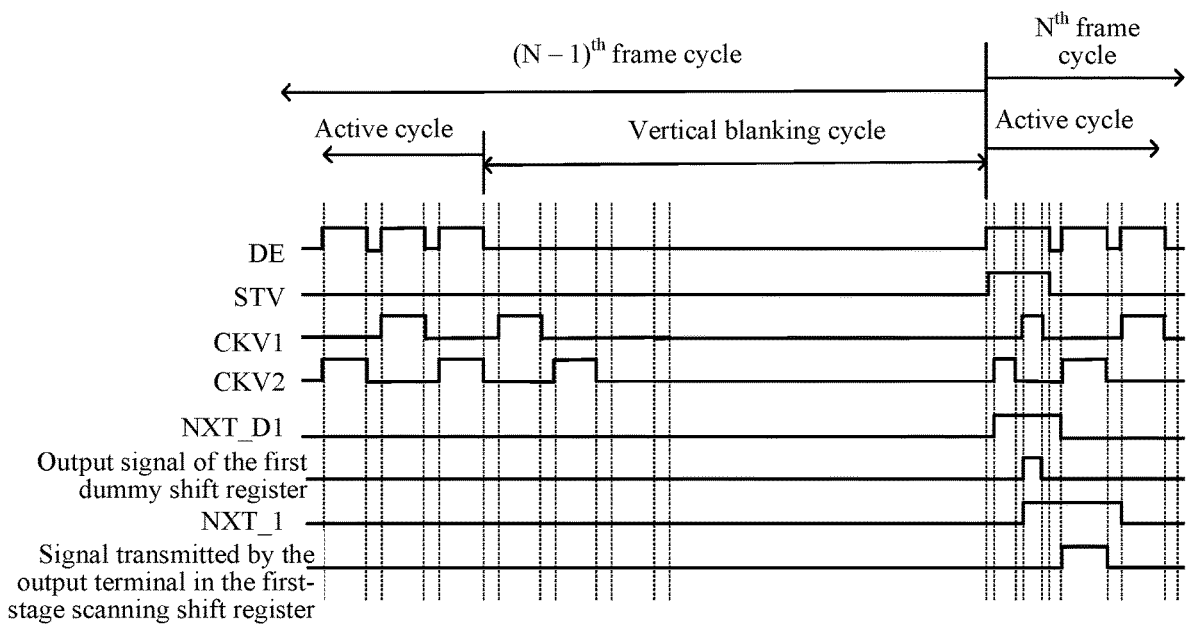
FIG. 12 is a driving timing diagram of a display device according to another embodiment of the present disclosure.

FIG. 12 is a driving timing diagram of a display device according to an embodiment of the present disclosure. When the timing controller 40 generates the rising edge and the falling edge of the start signal STV within the time interval formed by the rising edge and the falling edge of the first data enable signal DE in the $N^{th}$ frame cycle, within the time interval formed by the rising edge and the falling edge of the first data enable signal DE in the $N^{th}$ frame cycle, the falling edge of the start signal STV is generated after the falling edge of the first clock signal CKV1; or, the falling edge of the start signal STV is generated when the falling edge of the first clock signal CKV1 is generated. That is, within the time interval formed by the rising edge and the falling edge of the first data enable signal DE in the $N^{th}$ frame cycle, the rising edge and the falling edge of the first clock signal CKV1 are generated within a time interval formed by the rising edge and the falling edge of the start signal STV.

Referring to FIG. 11 and FIG. 12, when the timing controller 40 generates the rising edge and the falling edge of the start signal STV within the time interval formed by the rising edge and the falling edge of the first data enable signal DE in the $N^{th}$ frame cycle, the width of the first clock signal CKV1 generated within the time interval formed by the rising edge and the falling edge of the first data enable signal DE in the $N^{th}$ frame cycle is less than the width of the first clock signal CKV1 generated outside the first data enable signal DE in the $N^{th}$ frame cycle. The width of the second clock signal CKV2 generated within the time interval formed by the rising edge and the falling edge of the first data enable signal DE in the $N^{th}$ frame cycle is less than the width of the second clock signal CKV2 generated outside the first data enable signal DE in the $N^{th}$ frame cycle. In this embodiment of the present application, the first clock signal CKV1 and the second clock signal CKV2 generated within the time interval formed by the rising edge and the falling edge of the first data enable signal DE in the $N^{th}$ frame cycle are used for generating an output signal Dummy_1 of the first dummy shift register; and widths of the first clock signal CKV1 and the second clock signal CKV2 which are generated within the time interval formed by the rising edge and the falling edge of the first data enable signal DE in the $N^{th}$ frame cycle are less than widths of the first clock signal CKV1 and the second clock signal CKV2 in the normal display, respectively (for example, the width of the first clock signal CKV1 and the width of the second clock signal CKV2 in the normal display may each be equal to the width of a data enable signal DE). The widths of the first clock signal CKV1 and the second clock signal CKV2 which are generated within the time interval formed by the rising edge and falling edge of the first data enable signal DE in the $N^{th}$ frame cycle become smaller, therefore the width of the signal Dummy_1 becomes smaller. Since the signal Dummy_1 is not used for driving the pixels 20, the normal display of the display device is not affected. Additionally, the widths of the first clock signal CKV1 and the second clock signal CKV2 which are generated within the time interval formed by the rising edge and falling edge of the first data enable signal DE in the $N^{th}$ frame cycle become smaller, so that the width of the signal Dummy_1 becomes smaller, and the start signal STV, the first clock signal CKV1 and the second clock signal CKV2 are all located within the time interval formed by the rising edge and the falling edge of the first data enable signal DE in the $N^{th}$ frame cycle. In this way, a row of data may be transmitted to the data lines 22 through the source driver circuit in the driver chip 50 within the time interval formed by the rising edge and the falling edge of the second data enable signal DE in the $N^{th}$ frame cycle.

Referring to FIG. 11 and FIG. 12, when the timing controller 40 generates the rising edge and the falling edge of the start signal STV within the time interval formed by the rising edge and the falling edge of the first data enable signal DE in the $N^{th}$ frame cycle, the width of the first clock signal generated within the time interval formed by the rising edge and the falling edge of the first data enable signal DE in the $N^{th}$ frame cycle is less than the width of the first clock signal CKV1 generated within the time interval formed by the rising edge and the falling edge of the second data enable signal DE in the $N^{th}$ frame cycle, and the width of the second clock signal generated within the time interval formed by the rising edge and the falling edge of the first data enable signal in the $N^{th}$ frame cycle is less than the width of the second clock signal generated within the time interval formed by the rising edge and the falling edge of the second data enable signal in the $N^{th}$ frame cycle.

Referring to FIGS. 9, 11 and 12, the rising edge and the falling edge of the second clock signal CKV2 are generated within the time interval formed by the rising edge and the falling edge of the start signal STV. That is, the rising edge of the second clock signal CKV2 is generated when the rising edge of the start signal STV is generated, or the rising edge of the second clock signal CKV2 is generated after the rising edge of the start signal STV. The falling edge of the second clock signal CKV2 is generated when the falling edge of the start signal STV is generated, or the falling edge of the second clock signal CKV2 is generated before the falling edge of the start signal STV. Accordingly, the rising edge and the falling edge of the second clock signal CKV2 are generated within the time interval formed by the rising edge and the falling edge of the start signal STV, the second clock signal CKV2 within the time interval formed by the rising edge and the falling edge of the start signal STV serves as a transmission initiation signal of the first dummy shift register. Only when the second clock signal CKV2 is at the high level, input of the first dummy shift register (that is, the start signal STV) is transmitted to the inside of the first dummy shift register.

Referring to FIGS. 9, 11 and 12, within the time interval formed by the rising edge and the falling edge of the start signal STV, the rising edge of the second clock signal CKV2 is generated after the rising edge of the start signal STV, and the falling edge of the second clock signal CKV2 is generated before the falling edge of the start signal STV. The rising edge and the falling edge of the second clock signal CKV2 are both located between the generation time for the rising edge of the start signal STV and the generation time for the falling edge of the start signal STV. The width of the second clock signal CKV2 is less than the width of the start signal STV. The generation time for the rising edge of the second clock signal CKV2 does not overlap the generation time for the rising edge of the start signal STV. The generation time for the falling edge of the second clock signal CKV2 does not overlap the generation time for the falling edge of the start signal STV. The start signal STV is collected on the rising edge of the second clock signal CKV2, however, the rising edge actually has a process, that is, the rising edge lasts for a period of time. Accordingly, the rising edge of the second clock signal CKV2 is generated after the rising edge of the start signal STV, and the falling edge of the second clock signal CKV2 is generated before the falling edge of the start signal STV, in this manner, collecting the start signal STV on the rising edge of the second clock signal CKV2 is avoided, thereby improving the sampling accuracy for the start signal STV.

Timing diagrams shown in FIG. 11 and FIG. 12 correspond to the case of an even number of scanning shift registers, which are merely examples and not intended to limit the present disclosure. In other implementation modes, the driving timing of an odd number of scanning shift registers also satisfies the preceding embodiments. For example, in the driving timing of an odd number of scanning shift registers, the timing controller 40 generates the rising edge and the falling edge of the start signal STV within the time interval formed by the rising edge and the falling edge of the first data enable signal DE in the $N^{th}$ frame cycle.

Figure 13:
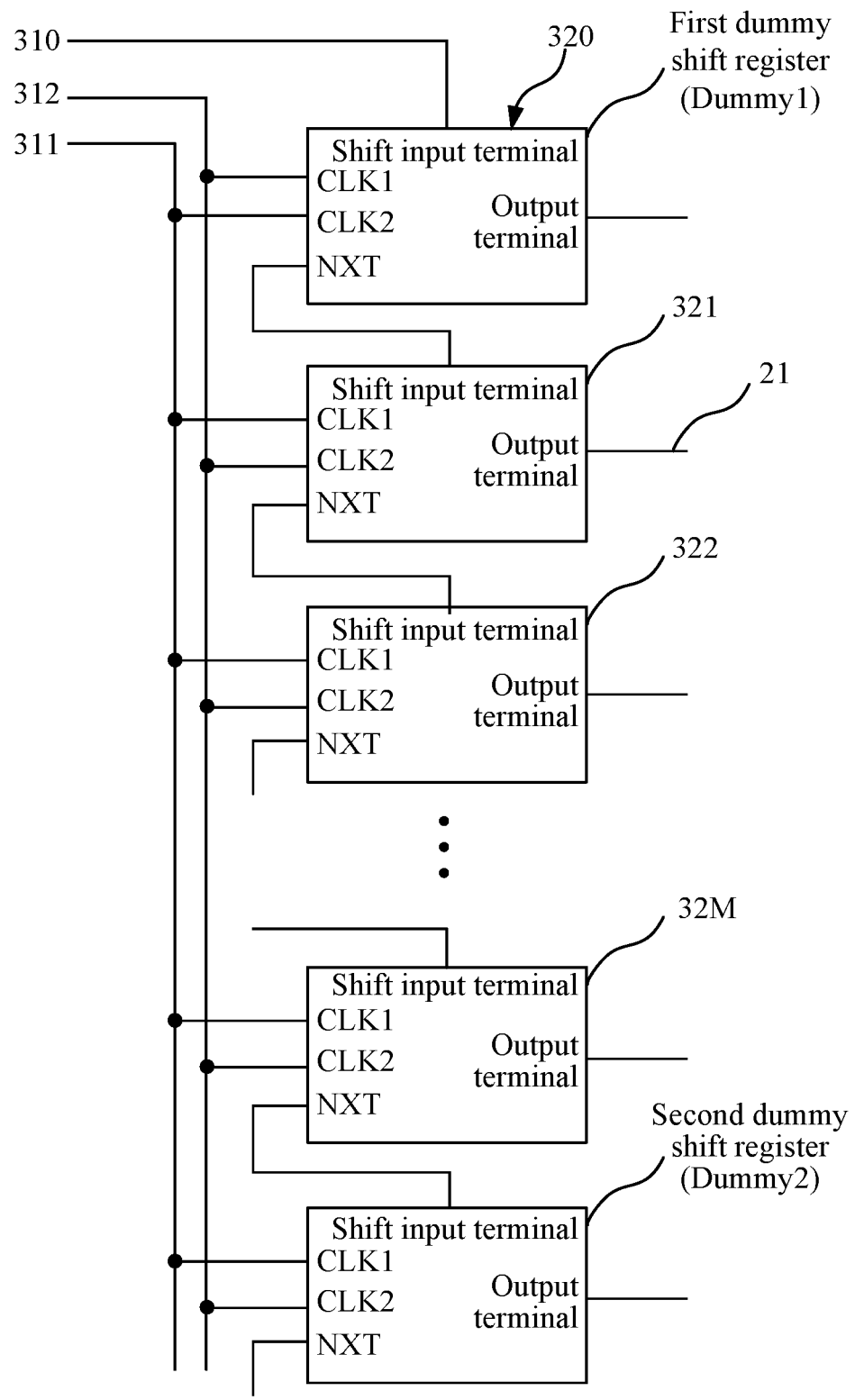
FIG. 13 is a schematic diagram of another gate driver circuit according to an embodiment of the present application.

FIG. 13 is a schematic diagram of a gate driver circuit according to another embodiment of the present application. A gate driver circuit 30 includes a start signal line 310 for transmitting a start signal STV, a first clock signal line 311 for transmitting a first clock signal CKV1, a second clock signal line 312 for transmitting a second clock signal CKV2, and multiple cascaded shift registers 320. A shift register 320 at each stage includes a shift input terminal IN, an output terminal OUT, a first signal terminal CLK1, a second signal terminal CLK2 and a cascade signal terminal NXT. The multiple shift registers 320 include a first dummy shift register Dummy1, and a first-stage scanning shift register 321 to an $M^{th}$-stage scanning shift register 32M (that is, the first-stage scanning shift register 321, a second-stage scanning shift register 322, . . . and the $M^{th}$-stage scanning shift register 32M). The first-stage scanning shift register 321 and the first dummy shift register Dummy1 are cascaded, and M≥2. First signal terminals CLK1 of the first dummy shift register Dummy1 and scanning shift registers at even stages (for example, the second-stage scanning shift register 322) are connected to the second clock signal line 312. Second signal terminals CLK2 of the first dummy shift register Dummy1 and the scanning shift registers at even stages are connected to the first clock signal line 311. First signal terminals CLK1 of scanning shift registers at odd stages (for example, the first-stage scanning shift register 321) are connected to the first clock signal line 311. Second signal terminals CLK2 of the scanning shift registers at odd stages are connected to the second clock signal line 312. The shift input terminal IN of the first dummy shift register Dummy1 is connected to the start signal line STV. The shift input terminal IN of the scanning shift register at each stage (including the first-stage scanning shift register 321, the second-stage scanning shift register 322, . . . and the $M^{th}$-stage scanning shift register 32M) is connected to the cascade signal terminal NXT of the shift register 320 at an upper stage.

Referring to FIG. 13, the gate driver circuit 30 may further include a second dummy shift register Dummy2. The shift input terminal IN of the second dummy shift register Dummy2 is connected to the cascade signal terminal NXT of the $M^{th}$-stage scanning shift register 32M. The cascade signal terminal NXT of the second dummy shift register Dummy2 may be connected to an external circuit. FIG. 13 illustrates an example where M is an odd number, which is not intended to limit the present application. In other implementation modes, M may further be an even number.

Figure 14:
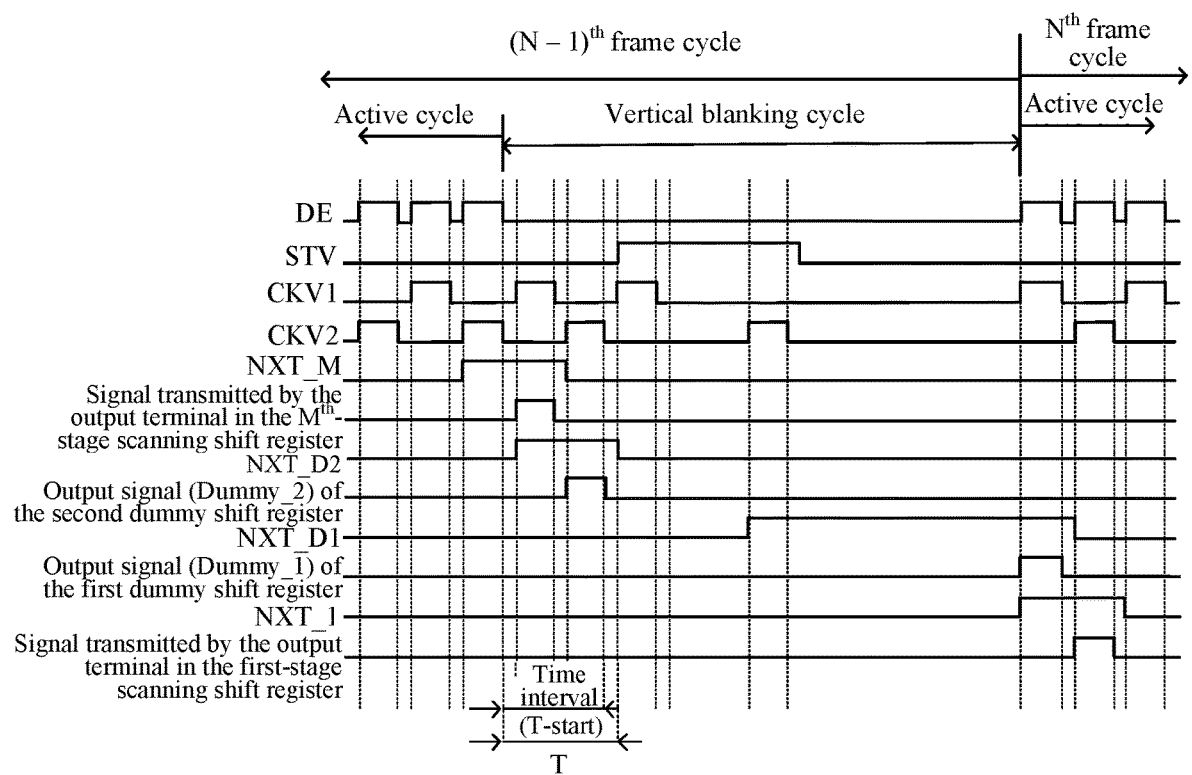
FIG. 14 is a driving timing diagram of a display device according to another embodiment of the present disclosure.

FIG. 14 is a drive timing diagram of a display device according to another embodiment of the present application. Referring to FIG. 13 and FIG. 14, when the timing controller 40 generates the rising edge of the start signal STV within the vertical blanking cycle V-blanking of the $(N-1)^{th}$ frame cycle, the operation principle of the first dummy shift register Dummy1 is as follows: the second clock signal CKV2 closest to the first data enable signal DE in the $N^{th}$ frame cycle needs to be pulled up within the time interval formed by the rising edge and the falling edge of the start signal STV, a rising edge of a signal NXT_D1 transmitted by the cascade signal terminal NXT in the first dummy shift register Dummy1 is generated when the rising edge of the second clock signal CKV2 is generated, and the signal NXT_D1 has a wider pulse width. When the second clock signal CKV2 changes from the low level to the high level, the shift input terminal IN of the first dummy shift register Dummy1 is turned on. At this time, the start signal STV is input through the shift input terminal IN, and the start signal STV is an input signal of the first dummy shift register Dummy1. Therefore, when the rising edge of the second clock signal CKV2 is generated, the start signal STV is latched into the first dummy shift register Dummy1. The signal NXT_D1 lasts to a rising edge of the next second clock signal CKV2 (that is, the second clock signal CKV2 within a time interval formed by a rising edge and a falling edge of a second data enable signal in the $N^{th}$ frame cycle). Then, the start signal STV is checked when the rising edge of the second clock signal CKV2 is generated within the time interval formed by the rising edge and the falling edge of the second data enable signal in the $N^{th}$ frame cycle. At this time, the start signal STV changes to the low level, and the signal NXT_D1 is pulled down to the low level. A signal Dummy_1 transmitted through the output terminal OUT in the first dummy shift register Dummy1 is generated by an AND operation on the signal NXT_D1 and a signal input through the second signal terminal CLK2 (that is, the first clock signal CKV1). A rising edge of the signal Dummy_1 is generated when the rising edge of the first clock signal CKV1 is generated.

Referring to FIG. 13 and FIG. 14, when the timing controller 40 generates the rising edge of the start signal STV within the vertical blanking cycle V-blanking of the $(N-1)^{th}$ frame cycle, the operation principle of the first-stage scanning shift register 321 is similar to the operation principle of the first dummy shift register Dummy1. The rising edge of the transmission signal NXT_1 of the cascade signal terminal NXT in the first-stage scanning shift register 321 is generated when the rising edge of the first clock signal CKV1 within a time interval formed by the rising edge and the falling edge of the first data enable signal DE in the $N^{th}$ frame cycle is generated. When the rising edge of the first clock signal CKV1 is generated, the transmission signal NXT_D1 of the shift input terminal IN of the first-stage scanning shift register 321 is latched into the first-stage scanning shift register 321. The signal NXT_1 lasts until the rising edge of the next first clock signal CKV1 (that is, the first clock signal CKV1 generated within a time interval formed by a rising edge and a falling edge of a third data enable signal DE in the $N^{th}$ frame cycle). Then, the signal NXT_D1 is checked when the rising edge of the first clock signal CKV1 is generated within the time interval formed by the rising edge and the falling edge of the third data enable signal DE in the $N^{th}$ frame cycle. At this time, the signal NXT_D1 changes to the low level, and the signal NXT_1 is also pulled down to the low level. A signal Gate_1 transmitted through the output terminal OUT in the first-stage shift register 321 is generated by an AND operation on the signal NXT_1 and the signal input through the second signal terminal CLK2 (that is, the second clock signal CKV2). The rising edge of the signal Gate_1 is generated when the rising edge of the second clock signal CKV2 is generated.

Referring to FIG. 13 and FIG. 14, a signal transmitted by the cascade signal terminal NXT in the $M^{th}$-stage scanning shift register 32M is NXT_M, and a signal transmitted by the output terminal OUT of the $M^{th}$-stage scanning shift register 32M is Gate_M. A signal transmitted by the cascade signal terminal NXT in the second dummy shift register Dummy2 is NXT_D2, and a signal transmitted by the output terminal OUT of the second dummy shift register Dummy2 is Dummy_2. Operation principles of the $M^{th}$-stage scanning shift register 32M and the second dummy shift register Dummy2 are similar to the operation principle of the first dummy shift register Dummy1, which are not repeated here.

The timing diagram in FIG. 14 corresponds to the case of an even number of scanning shift registers, which is merely an example and are not intended to limit the present application. In other implementation modes, the driving timing of an odd number of scanning shift registers also satisfies the preceding embodiments. The same part in the timing corresponding to odd-numbered scanning shift registers and the timing corresponding to the even-numbered shift registers has been described above. The embodiment shown in FIG. 14 describes different parts between the timing corresponding to the odd number of scanning shift registers and the timing corresponding to the even number of shift registers.

Referring to FIG. 14, for an even number of scanning shift registers (M=2 L): a first clock signal CKV1 is generated within a time interval formed by a rising edge and a falling edge of a $(2 L-1)^{th}$ data enable signal DE in the $(N-1)^{th}$ frame cycle; after an interval of one data enable signal DE, another first clock signal CKV1 is generated after a $2 L^{th}$ data enable signal DE; then, after another interval of one data enable signal DE, another first clock signal CKV1 is generated again. There are two first clock signals CKV1 within the vertical blanking cycle V-blanking of the $(N-1)^{th}$ frame cycle. A second clock signal CKV2 is generated within a time interval formed by a rising edge and a falling edge of a $(2 L-2)^{th}$ data enable signal DE in the $(N-1)^{th}$ frame cycle; after an interval of one data enable signal DE, another second clock signal CKV2 is generated within a time interval formed by a rising edge and a falling edge of the $2 L^{th}$ data enable signal DE; then, after another interval of one data enable signal DE, another second clock signal CKV2 is generated again. After the $1^{st}$ second clock signal CKV2 within the vertical blanking cycle V-blanking of the $(N-1)^{th}$ frame cycle, the rising edge of the start signal STV is generated, and the $2^{nd}$ second clock signal CKV2 within the vertical blanking cycle V-blanking is generated within a time interval between the rising edge and a falling edge of the start signal STV. A rising edge of the signal NXT_M is generated when the rising edge of the second clock signal CKV2 within a time interval formed by a rising edge and a falling edge of the last data enable signal DE in the $(N-1)^{th}$ frame cycle is generated and lasts until a rising edge of the next second clock signal CKV2. Accordingly, the signal Gate_M is generated within a time internal formed by a rising edge and a falling edge of the 1st first clock signal CKV1 in the vertical blanking cycle V-blanking of the $(N-1)^{th}$ frame cycle. The rising edge of the signal NXT_D2 is generated when the rising edge of the $1^{st}$ first clock signal CKV1 in the vertical blanking cycle V-blanking of the $(N-1)^{th}$ frame cycle is generated and lasts until the rising edge of the next first clock signal CKV1. The signal Dummy_2 is generated within a time internal formed by a rising edge and a falling edge of the $1^{st}$ second clock signal CKV2 in the vertical blanking cycle V-blanking of the $(N-1)^{th}$ frame cycle. In FIG. 14, P=2. A time interval between the falling edge of the last data enable signal DE in the $(N-1)^{h}$ frame cycle and the falling edge of the $1^{st}$ second clock signal CKV2 is (T-start). The rising edge of the start signal STV is generated after the falling edge of the $1^{st}$ second clock signal CKV2.

Figure 15:
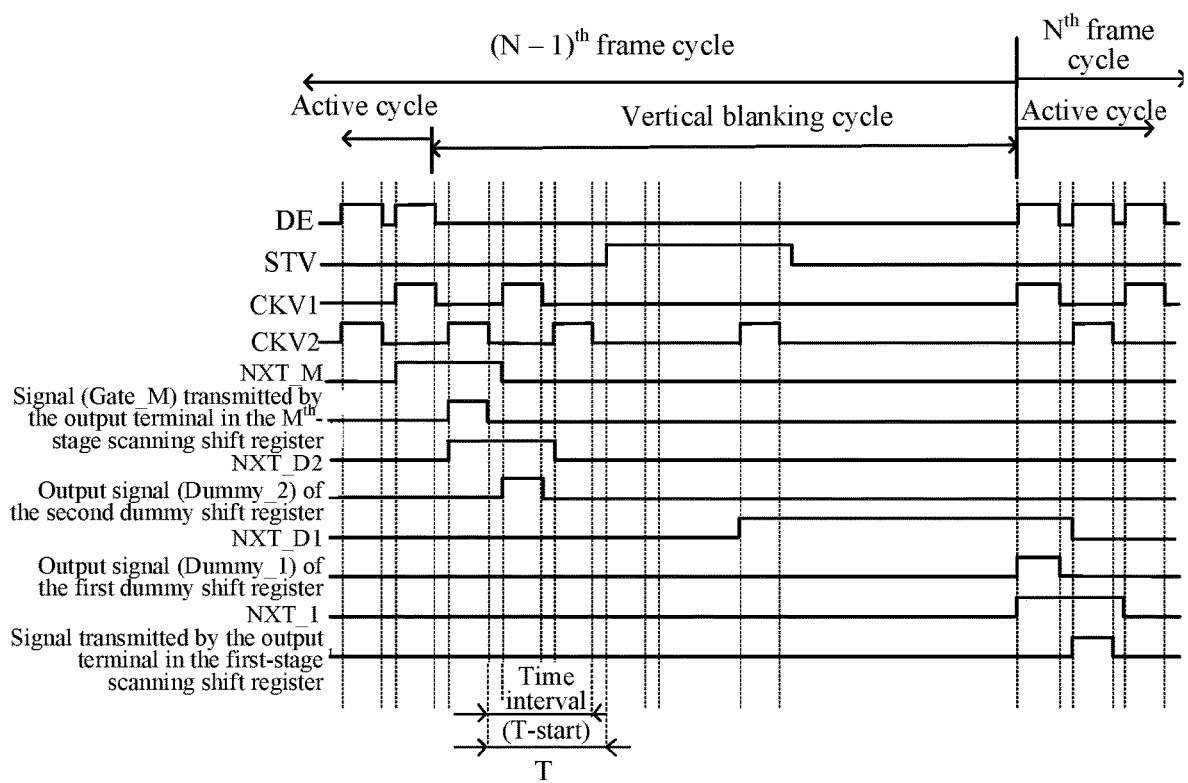
FIG. 15 is a driving timing diagram of a display device according to another embodiment of the present disclosure.

FIG. 15 is a driving timing diagram of a display device according to another embodiment of the present application. Referring to FIG. 15, for an odd number of scanning shift registers (M=2 L-1), a first clock signal CKV1 is generated within a time interval formed by a rising edge and a falling edge of a $(2 L-1)^{th}$ data enable signal DE in the $(N-1)^{th}$ frame cycle; and after an interval of one data enable signal DE, another first clock signal CKV1 is generated again. One first clock signal CKV1 exists within the vertical blanking cycle V-blanking of the $(N-1)^{th}$ frame cycle. A second clock signal CKV2 is generated within a time interval formed by a rising edge and a falling edge of a $(2 L-2)^{th}$ data enable signal DE in the $(N-1)^{th}$ frame cycle; after an interval of one data enable signal DE, another second clock signal CKV2 is generated after the $(2 L-1)^{th}$ data enable signal DE; and then, after another interval of one data enable signal DE, another second clock signal CKV2 is generated again. After the $2^{nd}$ second clock signal CKV2 in the vertical blanking cycle V-blanking of the $(N-1)^{th}$ frame cycle, the rising edge of the start signal STV is generated, and the $3^{rd}$ second clock signal CKV2 in the vertical blanking cycle V-blanking is generated within a time interval between the rising edge and the falling edge of the start signal STV. A rising edge of the signal NXT_M is generated when a rising edge of a first clock signal CKV1 within a time interval formed by a rising edge and a falling edge of the last data enable signal DE in the $(N-1)^{th}$ frame cycle is generated and lasts until a rising edge of the next first clock signal CKV1. Accordingly, the signal Gate_M is generated within a time internal formed by a rising edge and a falling edge of the $1^{st}$ second clock signal CKV2 in the vertical blanking cycle V-blanking of the $(N-1)^{th}$ frame cycle. A rising edge of the signal NXT_D2 is generated when the rising edge of the $1^{st}$ second clock signal CKV2 in the vertical blanking cycle V-blanking of the $(N-1)^{th}$ frame cycle is generated and lasts until a rising edge of the next second clock signal CKV2. The signal Dummy_2 is generated within a time internal formed by a rising edge and a falling edge of the $1^{st}$ first clock signal CKV1 in the vertical blanking cycle V-blanking of the $(N-1)^{th}$ frame cycle. In FIG. 15, P=3. A time interval between the falling edge of the last data enable signal DE in the $(N-1)^{th}$ frame cycle and the falling edge of the $2^{nd}$ second clock signal CKV2 is (T-start). The rising edge of the start signal STV is generated after the falling edge of the $2^{nd}$ second clock signal CKV2.

Figure 16:
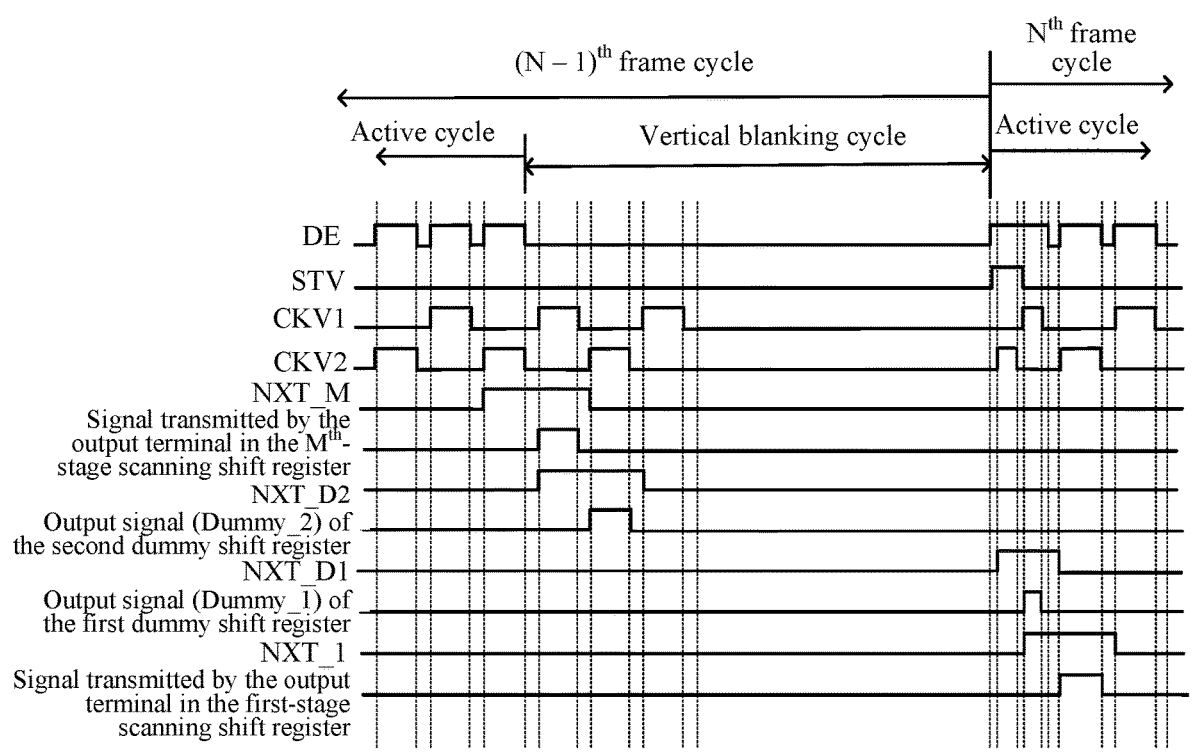
FIG. 16 is a driving timing diagram of a display device according to another embodiment of the present disclosure.

FIG. 16 is a driving timing diagram of a display device according to another embodiment of the present disclosure. Referring to FIG. 13 and FIG. 16, when the timing controller 40 generates the rising edge and the falling edge of the start signal STV within the time interval formed by the rising edge and the falling edge of the first data enable signal DE in the $N^{th}$ frame cycle, operation principles of the first dummy shift register Dummy1 and the first-stage scanning shift register 321 are the same as that in the case where the timing controller 40 generates the rising edge of the start signal STV within the vertical blanking cycle V-blanking of the $(N-1)^{th}$ frame cycle, which are not repeated here. When the timing controller 40 generates the rising edge and the falling edge of the start signal STV within the time interval formed by the rising edge and the falling edge of the first data enable signal DE in the $N^{th}$ frame cycle, the width of the first clock signal CKV1 and the width of the second clock signal CKV2 within the time interval formed by the rising edge and the falling edge of the first data enable signal DE in the N$^{th}$ frame cycle are shortened. Widths of the first-stage scanning shift register 321 to the M$^{th}$-stage scanning shift register 32M are not changed, and on-time widths of multiple scanning lines 21 are not changed compared with that in the related design. The first dummy shift register Dummy1 is dummy, and various signals output by the first dummy shift register Dummy1 merely play the role of triggering transmission, so the normal display of the display device is not affected.

The timing diagram in FIG. 16 corresponds to the case of an even number of scanning shift registers, which is merely an example and not intended to limit the present disclosure. In other implementation modes, the driving timing of an odd number of scanning shift registers also satisfies the preceding embodiments. The same part in the timing corresponding to the odd number of scanning shift registers and the timing corresponding to the even number of shift registers has been described above. The embodiment shown in FIG. 16 describes different parts between the timing corresponding to the odd number of scanning shift registers and the timing corresponding to the even number of shift registers.

Referring to FIG. 16, for an even number of scanning shift registers (M=2 L): a first clock signal CKV1 is generated within the time interval formed by the rising edge and the falling edge of the (2 L−1)$^{th}$ data enable signal DE in the (N−1)$^{th}$ frame cycle; after an interval of one data enable signal DE, another first clock signal CKV1 is generated after the 2 L$^{h}$ data enable signal DE; and then, after another interval of one data enable signal DE, another first clock signal CKV1 is generated again. Two first clock signals CKV1 exist within the vertical blanking cycle V-blanking of the (N−1)$^{th}$ frame cycle. A second clock signal CKV2 is generated within the time interval formed by the rising edge and the falling edge of the (2 L−2)$^{th}$, data enable signal DE in the (N−1)$^{th}$ frame cycle; after an interval of one data enable signal DE, another second clock signal CKV2 is generated within the time interval formed by the rising edge and the falling edge of the 2 L' data enable signal DE; and then, after another interval of one data enable signal DE, another second clock signal CKV2 is generated again. A rising edge of the signal NXT_M is generated when a rising edge of a second clock signal CKV2 within a time interval formed by a rising edge and a falling edge of the last data enable signal DE in the (N−1)$^{th}$ frame cycle is generated and lasts until a rising edge of the next second clock signal CKV2. Accordingly, a rising edge of the signal Gate_M is generated within a time interval formed by a rising edge and a falling edge of the 1$^{st}$ first clock signal CKV1. A rising edge of the signal NXT_D2 is generated at the rising edge of the 1$^{st}$ first clock signal CKV1 in the vertical blanking cycle V-blanking of the (N−1)$^{th}$ frame cycle and lasts until a rising edge of the next first clock signal CKV1. The signal Dummy_2 is generated within a time internal formed by a rising edge and a falling edge of the 1$^{st}$ second clock signal CKV2 in the vertical blanking cycle V-blanking of the (N−1)$^{th}$ frame cycle.

Figure 17:
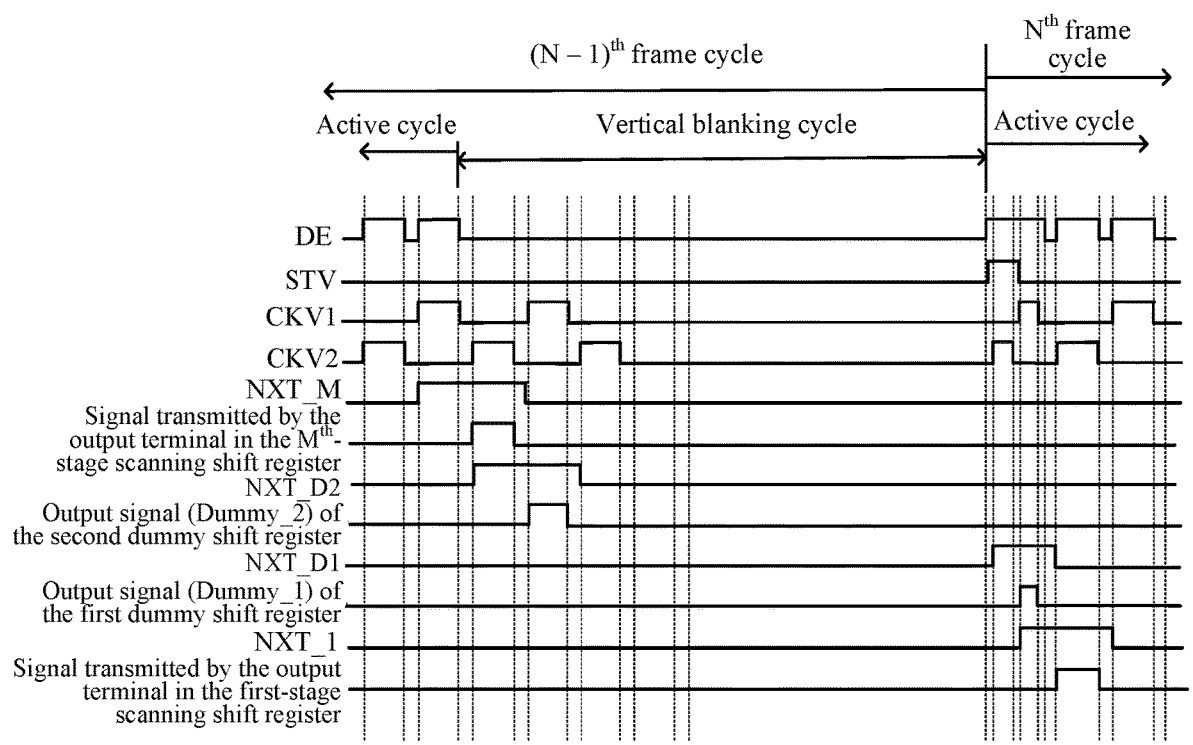
FIG. 17 is a driving timing diagram of a display device according to another embodiment of the present disclosure.

FIG. 17 is a driving timing diagram of a display device according to another embodiment of the present application. for an odd number of scanning shift registers (M=2 L−1): a first clock signal CKV1 is generated within the time interval formed by the rising edge and the falling edge of the (2 L−1)$^{th}$ data enable signal DE in the (N−1)$^{th}$ frame cycle; and after an interval of one data enable signal DE, another first clock signal CKV1 is generated. One first clock signal CKV1 exists within the vertical blanking cycle V-blanking of the (N−1)$^{th}$ frame cycle. A second clock signal CKV2 is generated within the time interval formed by the rising edge and the falling edge of the (2 L−2)$^{th}$ data enable signal DE in the (N−1)$^{th}$ frame cycle; after an interval of one data enable signal DE, another second clock signal CKV2 is generated; and after another interval of one data enable signal DE, another second clock signal CKV2 is generated again. Two second clock signals CKV2 exist within the vertical blanking cycle V-blanking of the (N−1)$^{th}$ frame cycle. A rising edge of the signal NXT_M is generated when a rising edge of the first clock signal CKV1 within the time interval formed by the rising edge and a falling edge of the last data enable signal DE in the (N−1)$^{th}$ frame cycle is generated and lasts until a rising edge of the next first clock signal CKV1. Accordingly, the signal Gate_M is generated within the time internal formed by the rising edge and the falling edge of the 1$^{st}$ second clock signal CKV1 in the vertical blanking cycle V-blanking of the (N−1)$^{th}$ frame cycle. A rising edge of the signal NXT_D2 is generated when a rising edge of the 1$^{st}$ second clock signal CKV2 in the vertical blanking cycle V-blanking of the (N−1)$^{th}$ frame cycle is generated and lasts until a rising edge of the next second clock signal CKV2. The signal Dummy_2 is generated within the time interval formed by the rising edge and the falling edge of the 1$^{st}$ first clock signal CKV1 in the vertical blanking cycle V-blanking of the (N−1)$^{th}$ frame cycle.

Figure 18:
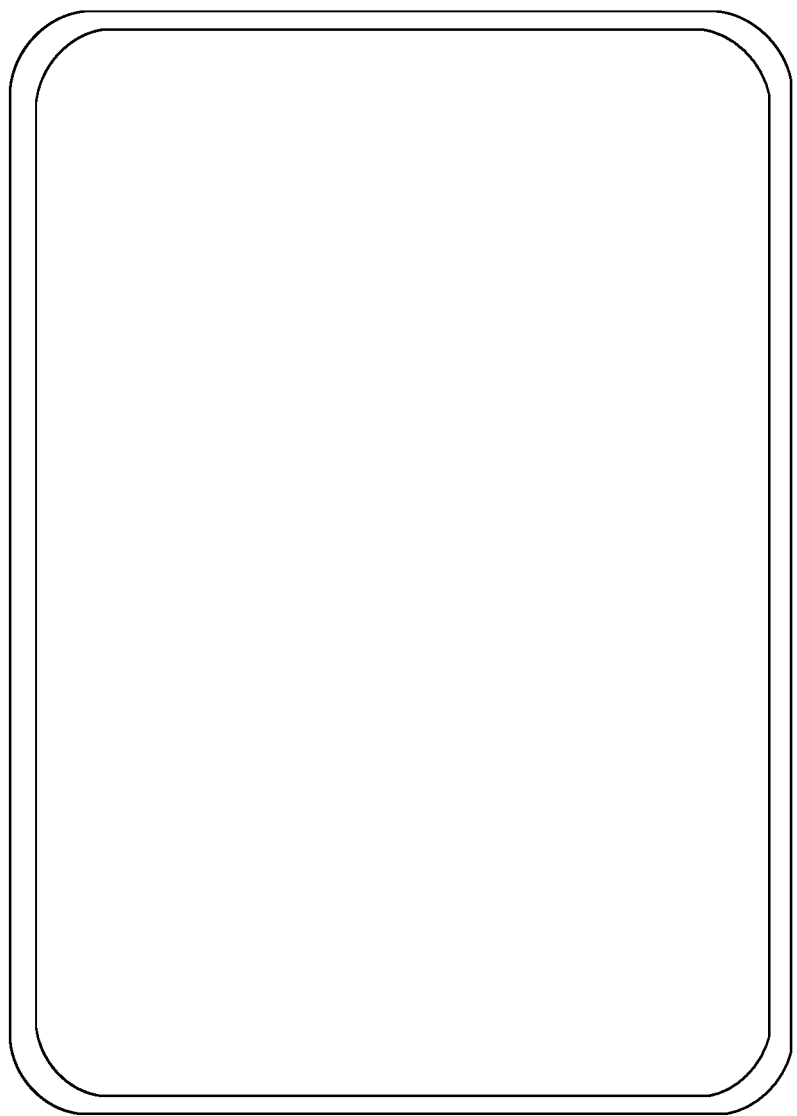
FIG. 18 is a top view of a display device according to another embodiment of the present disclosure.

FIG. 18 is a top view of a display device according to an embodiment of the present application. Referring to FIG. 1 and FIG. 18, the display device includes multiple scanning lines 21, a gate drive circuit 30 and a timing controller 40. The display device may be a mobile phone, a tablet computer, a smart wearable apparatus and the like.

What is claimed is:

1. A display device, comprising:
   a plurality of scanning lines;
   a gate driver circuit electrically connected to the plurality of scanning lines; and
   a timing controller electrically connected to the gate driver circuit;
   wherein the timing controller is configured to:
      receive a plurality of data enable signals within each frame cycle of a plurality of frame cycles,
      generate a gate control signal according to the plurality of data enable signals, and
      provide the gate control signal for the gate driver circuit;
   wherein the gate driver circuit is configured to provide scanning signals for the plurality of scanning lines according to the gate control signal;
   wherein the gate control signal comprises a start signal, a first clock signal and a second clock signal;
   wherein each frame cycle comprises an active cycle and a vertical blanking cycle, and the plurality of data enable signals are only within the active cycle; and
   wherein the timing controller is configured to generate a rising edge of the start signal within the vertical blanking cycle of an (N−1)th frame cycle,
   wherein a time interval between a falling edge of a last data enable signal in the (N−1)th frame cycle and the rising edge of the start signal is T,
   wherein T is greater than 0 and less than a first preset time interval, or T is greater than 0 and equal to a first preset time interval,
   wherein the first preset time interval is less than ⅔ of the vertical blanking cycle;
   and
   wherein:

(a) a falling edge of the start signal is generated within a time interval formed by a rising edge and a falling edge of a first data enable signal in an Nth frame cycle;

or (b) P second clock signals are generated within the (N−1)th frame cycle, a time interval between the falling edge of the last data enable signal in the (N−1)th frame cycle and a falling edge of a (P−1)th second clock signal among the P second clock signals is (T−start), T is greater than (T−start), and P>2;

or (c) a falling edge of a 1st first clock signal in an Nth frame cycle is generated when a falling edge of a first data enable signal in the Nth frame cycle is generated, and a rising edge of the 1st first clock signal in the Nth frame cycle is generated within a time interval defined by a falling edge of the start signal and a rising edge of the first data enable signal in the Nth frame cycle.

2. The display device of claim 1, wherein the rising edge of the start signal is generated after the falling edge of the last data enable signal in the (N−1)th frame cycle.

3. The display device of claim 1, wherein when either (b) or (c), a falling edge of the start signal is generated within the vertical blanking cycle of the (N−1)th frame cycle.

4. The display device of claim 1, wherein the first preset time interval is less than half of the vertical blanking cycle.

5. The display device of claim 1, wherein a rising edge and a falling edge of the second clock signal are generated within a time interval defined by the rising edge and the falling edge of the start signal.

6. The display device of claim 1, wherein within a time interval defined by the rising edge and the falling edge of the start signal, a rising edge of the second clock signal is generated after the rising edge of the start signal, and a falling edge of the second clock signal is generated before the falling edge of the start signal.

7. The display device of claim 1, wherein the gate driver circuit comprises a start signal line for transmitting the start signal, a first clock signal line for transmitting the first clock signal, a second clock signal line for transmitting the second clock signal, and a plurality of cascaded shift registers; wherein a shift register at each stage among the plurality of shift registers comprises a shift input terminal, an output terminal, a first signal terminal, a second signal terminal and a cascade signal terminal; wherein the plurality of shift registers comprise a first dummy shift register and a first-stage scanning shift register to an $M^{th}$-stage scanning shift register, wherein the first-stage scanning shift register and the first dummy shift register are cascaded, and $M \geq 2$;

wherein first signal terminals of scanning shift registers at even stages and the first dummy shift register are connected to the second clock signal line, and wherein the second signal terminals of the scanning shift registers at the even stages and the first dummy shift register are connected to the first clock signal line;

wherein first signal terminals of scanning shift registers at odd stages are connected to the first clock signal line, and wherein second signal terminals of the scanning shift registers at the odd stages are connected to the second clock signal line; and wherein the shift input terminal of the first dummy shift register is connected to the start signal line, and the shift input terminal of a scanning shift register at each stage is connected to the cascade signal terminal of a scanning shift register at an upper stage of the scanning shift register at the each stage.

* * * * *